United States Patent
Kamineni et al.

(10) Patent No.: US 9,570,344 B2
(45) Date of Patent: Feb. 14, 2017

(54) METHOD TO PROTECT MOL METALLIZATION FROM HARDMASK STRIP PROCESS

(71) Applicant: GLOBALFOUNDRIES Inc., Grand Cayman (KY)

(72) Inventors: Vimal Kamineni, Mechanicville, NY (US); Nicholas Vincent Licausi, Watervliet, NY (US); Shariq Siddiqui, Albany, NY (US); Jeremy Austin Wahl, Delmar, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/752,210

(22) Filed: Jun. 26, 2015

(65) Prior Publication Data
US 2016/0379872 A1 Dec. 29, 2016

(51) Int. Cl.
*H01L 21/00* (2006.01)
*H01L 21/768* (2006.01)
*H01L 23/535* (2006.01)

(52) U.S. Cl.
CPC ... *H01L 21/76834* (2013.01); *H01L 21/76805* (2013.01); *H01L 23/535* (2013.01)

(58) Field of Classification Search
CPC .................................................. H01L 21/4763
See application file for complete search history.

(56) References Cited

U.S. PATENT DOCUMENTS

| | | | |
|---|---|---|---|
| 6,362,093 B1* | 3/2002 | Jang | H01L 21/76808 257/E21.579 |
| 2014/0327140 A1* | 11/2014 | Zhang | H01L 21/76843 257/751 |
| 2015/0279733 A1* | 10/2015 | Ferrer | H01L 21/76877 257/734 |

* cited by examiner

*Primary Examiner* — William Harriston
(74) *Attorney, Agent, or Firm* — Heslin Rothenberg Farley and Mesiti PC; Nicholas Mesiti

(57) ABSTRACT

A method can include forming a contact trench in a semiconductor structure so that the contact trench extends to a contact formation, the forming including using a hardmask layer, and filling the contact trench with a sacrificial material layer, the sacrificial material layer formed over the contact formation. A semiconductor structure can include a sacrificial material layer over a contact formation.

17 Claims, 8 Drawing Sheets

… (1)

METHOD TO PROTECT MOL METALLIZATION FROM HARDMASK STRIP PROCESS

TECHNICAL FIELD

The present disclosure relates to a semiconductor structure and more particularly a method for formation of a semiconductor structure that preserves material of a contact formation.

BACKGROUND OF THE INVENTION

A gate of a semiconductor structure can include gate spacers having gate sidewalls, a gate dielectric layer and gate work function conductive material. According to a known approach for fabrication of a gate contact structure, a dielectric layer can be formed over the gate. A gate contact trench can be formed that extends through the dielectric layer. A gate contact formation can be formed in the gate contact trench. The gate contact formation can span a vertical spacing distance from a top elevation of the conductive gate work function material to a top elevation of the dielectric layer.

A semiconductor structure can include source-drain areas that together with the gate can define a transistor. A dielectric layer, e.g. Middle of Line (MOL) layer can be formed over the associated source-drain areas. Source-drain contact trenches can be formed in the dielectric layer and a contact formation can be a formed in the source-drain contact trenches.

BRIEF DESCRIPTION

A method can include forming a contact trench in a semiconductor structure so that the contact trench extends to a contact formation, the forming including using a hardmask layer, and filling the contact trench with a sacrificial material layer, the sacrificial material layer formed over the contact formation. A semiconductor structure can include a sacrificial material layer over a contact formation.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
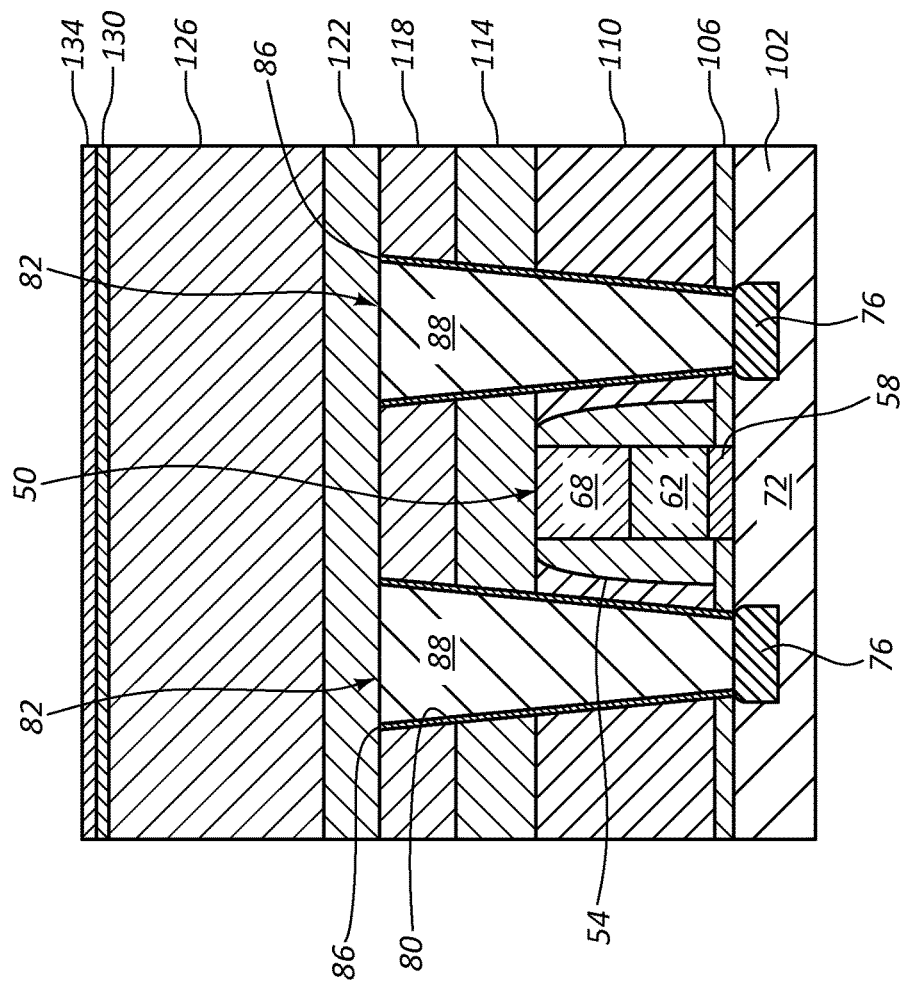
FIG. 1 is a cutaway side view of a semiconductor structure.

A semiconductor structure 10 is shown in FIG. 1. Semiconductor structure 10 can include a substrate 102, a gate 50 having gate spacers 54, a gate dielectric layer 58, a gate work function material formation 62, and a gate contact formation 68. Semiconductor structure 10 can also include a channel area 72 under gates 50 and source-drain areas 76. Semiconductor structure 10 can also include dielectric layers 106, 110, 114, 118, 122, 126, 130, 134. Layer 106 can be a pad oxide layer. Layer 110 can be an oxide layer. Layer 114 can be a nitride layer. Layer 118 can be an oxide layer and layer 122 can be dielectric capping layer. Layer 126 can be an ultra low k (ULK) material layer.

Semiconductor structure 10 can also include contact formations 82. Contact formations 82 can include a first layer 86 and a second layer 88. First layer 86 in one embodiment can be a formed of titanium nitride (TiN). First layer 86 can be regarded as a liner. Second layer 88 can be formed of tungsten, (W). In another embodiment, second layer 88 can be formed of cobalt (Co). Contact formation 82 can be formed in contact trenches 80.

Semiconductor structure 10 can also include hardmask layer 130 and hardmask layer 134. Hardmask layer 130 can be a dielectric hardmask layer (e.g. SiN can be used to protect the metal layers from oxidation) and hardmask layer 134 can be a conductive hardmask layer. In one embodiment hardmask layer 134 can be adapted to provide patterning memorization. Hardmask layer 130 and hardmask layer 134 can be used to form contact trenches in which contact formations can be formed.

Layers 106, 110, 114, 118 can be regarded as MOL Layers. Layers 122, 126, 130, 134 can be regarded as Back End of Line (BEOL) layers.

A method herein can prevent damage to contact formation 82. In the development of methods herein it was determined that contact formation 82 can become damaged by subsequent processing of semiconductor structure 10 subsequent to the formation of formation 82. In one aspect it was determined that contact formation 82, which can be regarded as a MOL contact formation, can become damaged by later stage processing of semiconductor structure 10 for formation of BEOL contact formations.

In the development of methods herein it was determined that where material of formation 82, e.g. of layer 86 and/or layer 88 can be undesirably removed when material of layer 134 is intentionally removed. For example, a wet etch process can be used to strip away material of hardmask layer 134. It was determined that when a wet etch process is used to strip away hardmask layer 134, a wet etch press can attack layer 86 and/or layer 88.

In one embodiment, layer 134 can be non-selective with layer 86. In one embodiment, layer 134 can be non-selective with layer 88. In one embodiment, layer 134 can be non-selective with layer 86 and layer 88. Layer 134 as well as layer 86 and/or layer 88 can have one or more common characteristic that causes material of layer 86 and/or layer 88 to be susceptible to removal when material of layer 134 is removed. In one embodiment layer 134 as well as layer 86 and/or layer 88 can both be formed of conductive material. In one embodiment layer 134 as well as layer 86 and/or layer 88 can be formed of nitrides. In one embodiment, layer 134 as well as layer 86 and/or layer 88 can include a common element, e.g. layer 134 can be formed of TiN and layer 86 and/or layer 88 can be formed of Ti. In one embodiment layer 134 and layer 86 and/or layer 88 can be formed of a common material, e.g., layer 134 can be formed of TiN and layer 86 and/or layer 88 can be formed of TiN.

Figure 2:
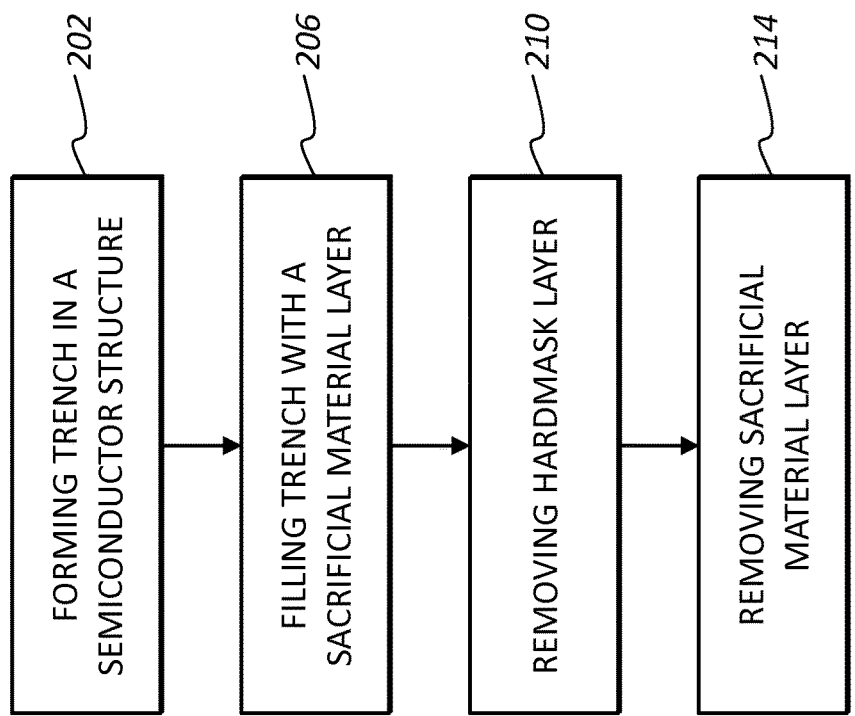
FIG. 2 is a flow diagram illustrating a method for protecting an MOL metallization layer.

Referring to the flow diagram of FIG. 2 a method for protection of material of formation 82 is described.

At block 202 there can be performed forming a contact trench in a semiconductor structure so that the contact trench extends to a contact formation, the forming including using a hardmask layer.

At block 206 there can be performed filling the trench with a sacrificial material layer, the sacrificial material layer formed over the contact structure.

At block 210 there can be performed removing the hardmask layer.

At block 214 there can be performed removing the sacrificial material layer from the trench to expose the contact formation.

Further aspects of the method of FIG. 2 are set forth in reference to the intermediary fabrication stage views of FIGS. 3 through 6.

Figure 3:
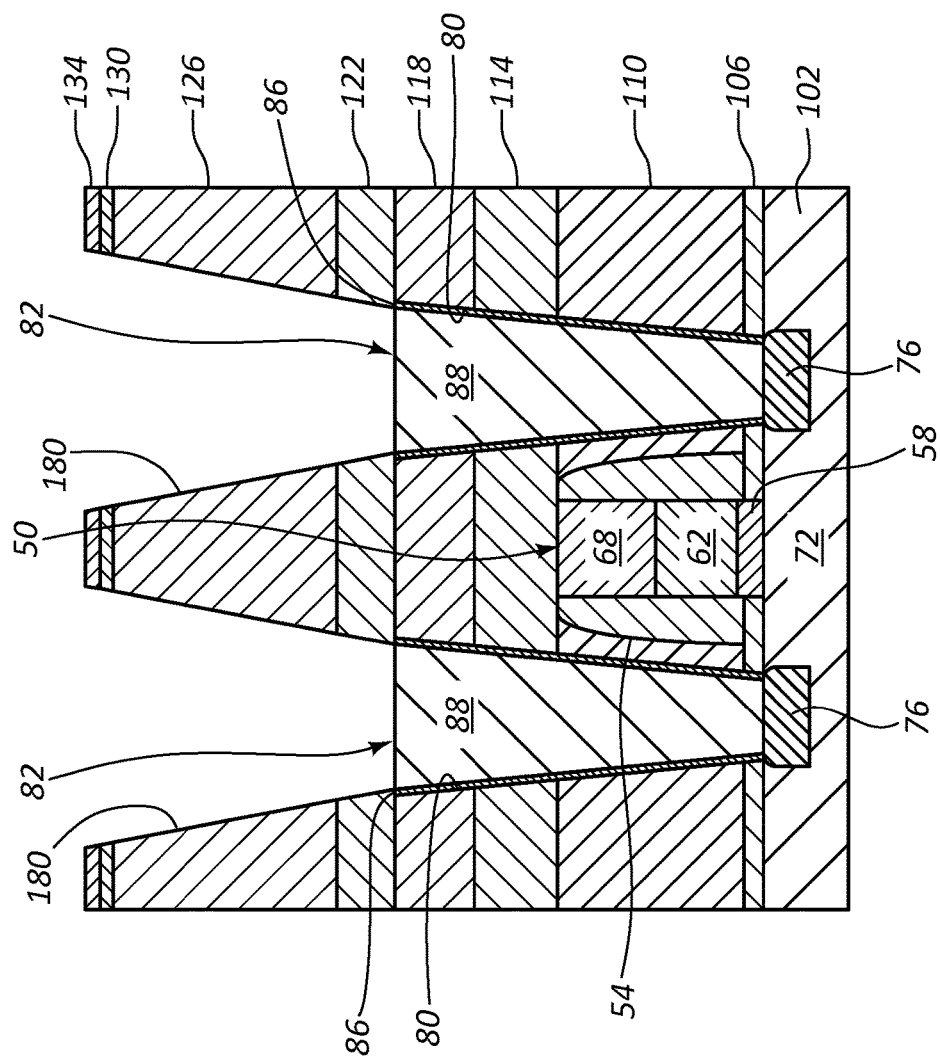
FIG. 3 is a cutaway side view of the semiconductor structure as shown in FIG. 1, after formation of a trench having a bottom elevation terminating a top elevation of a contact formation.

FIG. 3 illustrates performance of block 202 in one embodiment. FIG. 3 illustrates forming a contact trench 180 in a semiconductor structure 10 which semiconductor structure 10 includes a contact formation 82, the forming including using a hardmask layer 134. In the formation of trench 180, one or more hardmask layer, e.g., layer 130 and/or layer 134 can be used. As shown in FIG. 3, contact trench 180 can extend to contact formation 82. A forming of contact trench 180 can expose contact formation 82.

Figure 4:
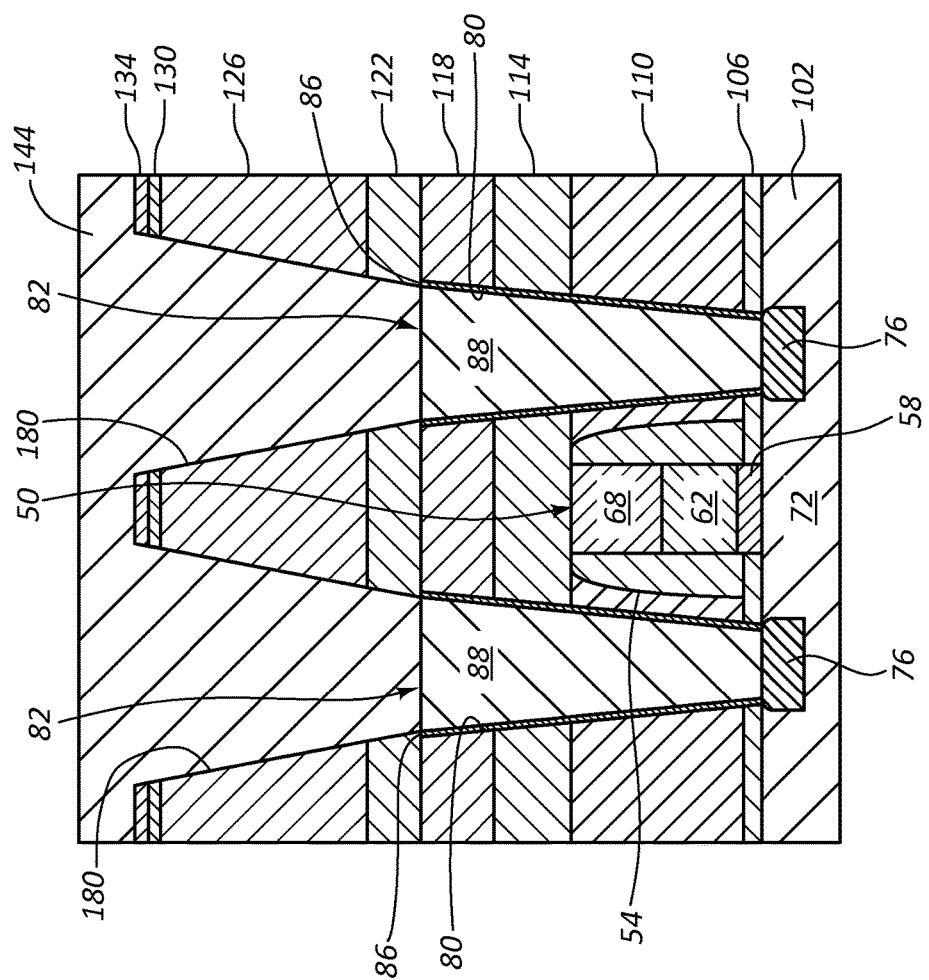
FIG. 4 is a cutaway side view of the semiconductor structure of FIG. 3 after formation of a sacrificial material layer in a contact trench.
Figure 5:
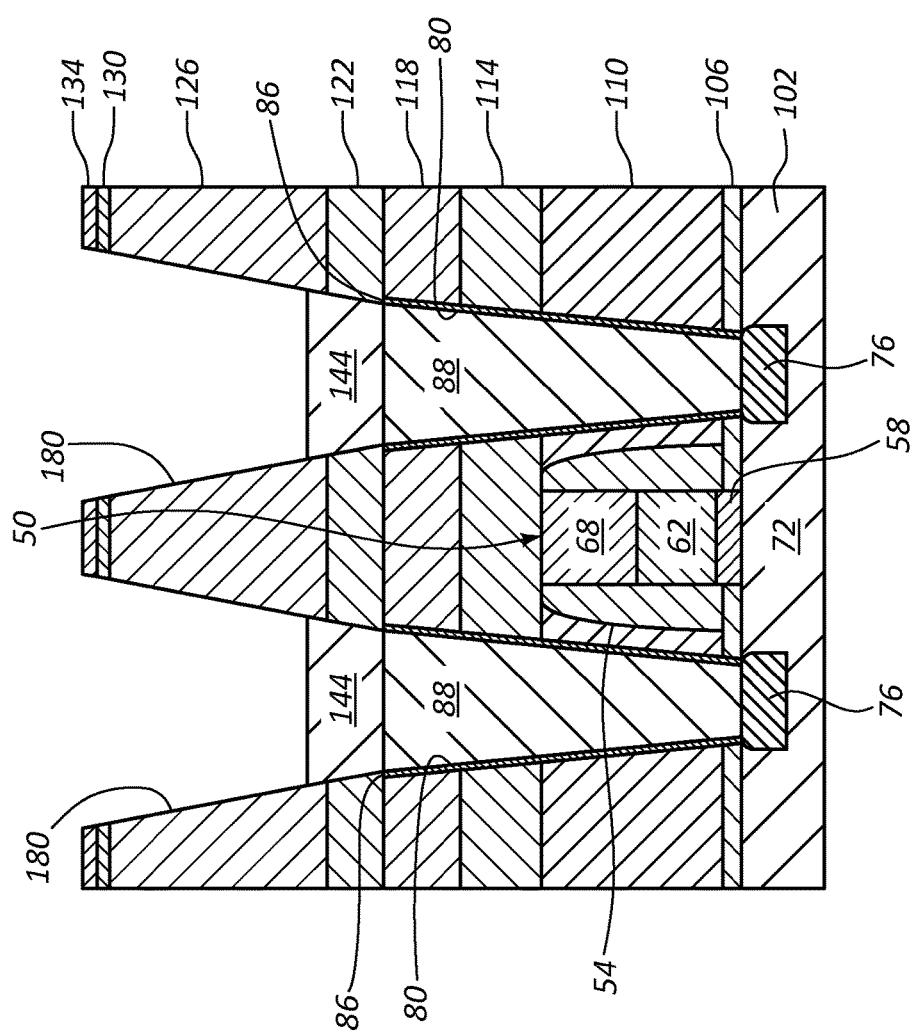
FIG. 5 is a cutaway side view of a semiconductor structure after recessing of a sacrificial material layer.

FIGS. 4 and 5 illustrate performance of block 206 in one embodiment. FIGS. 4 and 5 illustrate filling the trench 180 with a sacrificial material layer 144, the sacrificial material layer 144 formed over the contact formation 82. In one embodiment, sacrificial material layer 144 can be formed on contact formation 82 as shown in FIGS. 4 and 5. Referring to FIG. 4 sacrificial material layer 144 for performance of block 206 (filling of sacrificial material layer 144) can be initially overfilled (FIG. 4) and then recessed (FIG. 5) to partially fill contact trench 180.

In one aspect sacrificial material layer 144 as shown in FIGS. 4 and 5 can be conformal. Configuring sacrificial material layer 144 to be conformal can assure that sacrificial material layer 144 adequately fills contact trench 180 to protect contact formation 82.

In one aspect sacrificial material layer 144 as shown in FIGS. 4 and 5 can have selectivity with respect to layer 126 to restrict removal of material from layer 126 when material layer 144 is removed for recessing of layer 144 or for removal of layer to expose contact formation 82. In one embodiment, layer 126 can be formed of ultra low k dielectric material. Layer 126 can include critical dimensions (CDs) with small tolerances and so significant advantages can be yielded by avoiding damage to layer 126.

In one embodiment, sacrificial material layer 144 can be formed of non-conductive material. In one embodiment, sacrificial material layer 144 can be formed of carbon based material. In one embodiment, sacrificial material layer 144 can be formed of dielectric material. In one embodiment, sacrificial material layer 144 can be formed of oxide. In one embodiment, sacrificial material layer 144 can be formed of conformal material.

In one embodiment, sacrificial material layer 144 as shown in FIGS. 4 and 5 can be formed of carbon based material, and removal of material from layer 144 can be performed using a plasma etching process. A remote plasma etch process can be used to selectively remove material of sacrificial material layer 144 from contact trench 180 when sacrificial material layer 144 is formed of a carbon based material. In one embodiment, sacrificial material layer 144 can be formed of spin-on carbon (SOC).

In one embodiment, sacrificial material layer 144 as shown in FIGS. 4 and 5 can be formed of an oxide and a wet etch process can be used to selectively remove material from sacrificial material layer 144.

Figure 6:
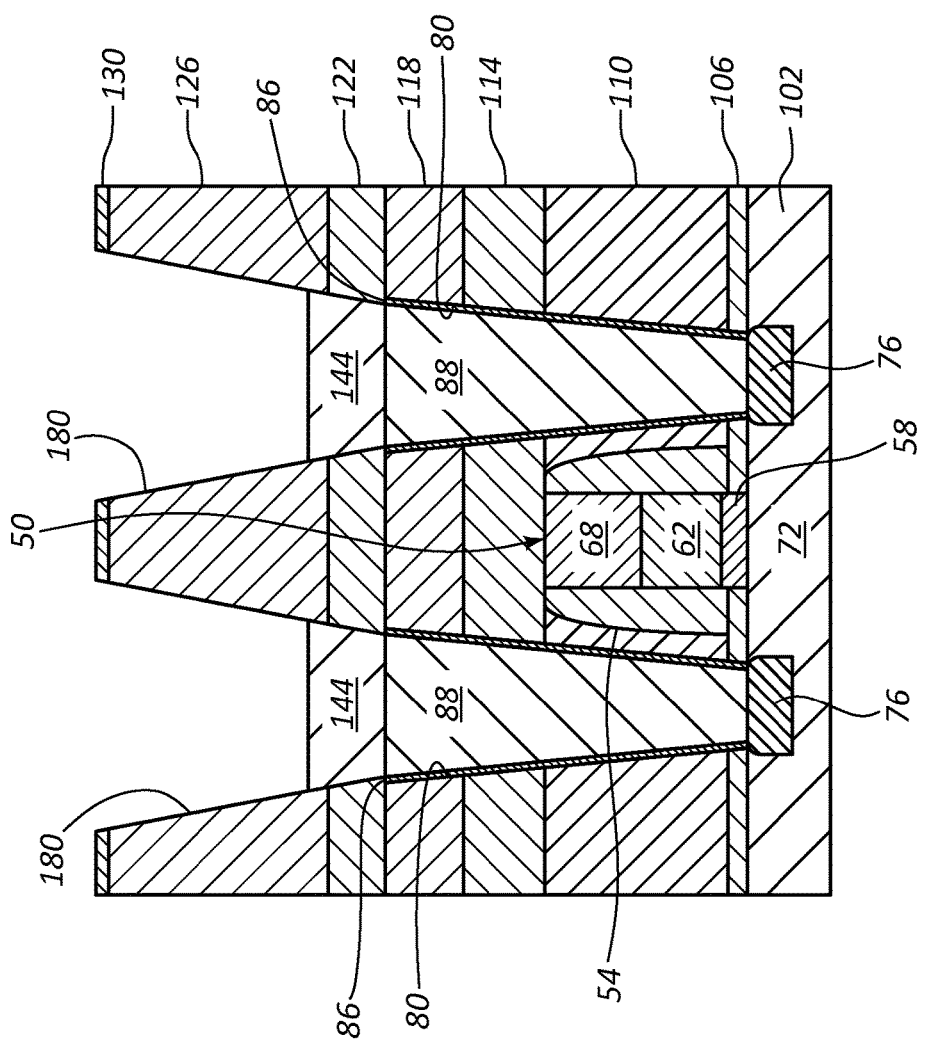
FIG. 6 is a cutaway side view of a semiconductor structure as shown in FIG. 5, after stripping a hardmask layer.

FIG. 6 illustrates performance of block 210 in one embodiment. Referring to FIG. 6 there can be performed removing the hardmask layer 134. Referring to FIG. 6 hardmask layer 134 can be removed from structure 10. In one embodiment, a wet etch process can be used to remove hardmask layer 134. It was determined that one or more layer of contact formation 82, e.g., layer 86 and/or layer 88, can be susceptible to attack when a process is performed to remove hardmask layer 134. However, according to a method set forth herein a presence of a sacrificial material layer 144 can protect layer 86 and/or layer 88 from damage when a process is performed for removal of hardmask layer 134. In one embodiment, layer 86 can be susceptible to attack where hardmask layer 134 is provided by TiN and layer 86 is provided by Ti or TiN. In one embodiment, layer 88 can be susceptible to attack where hardmask layer 134 is provided by TiN and layer 88 is provided by cobalt (Co).

Figure 7:
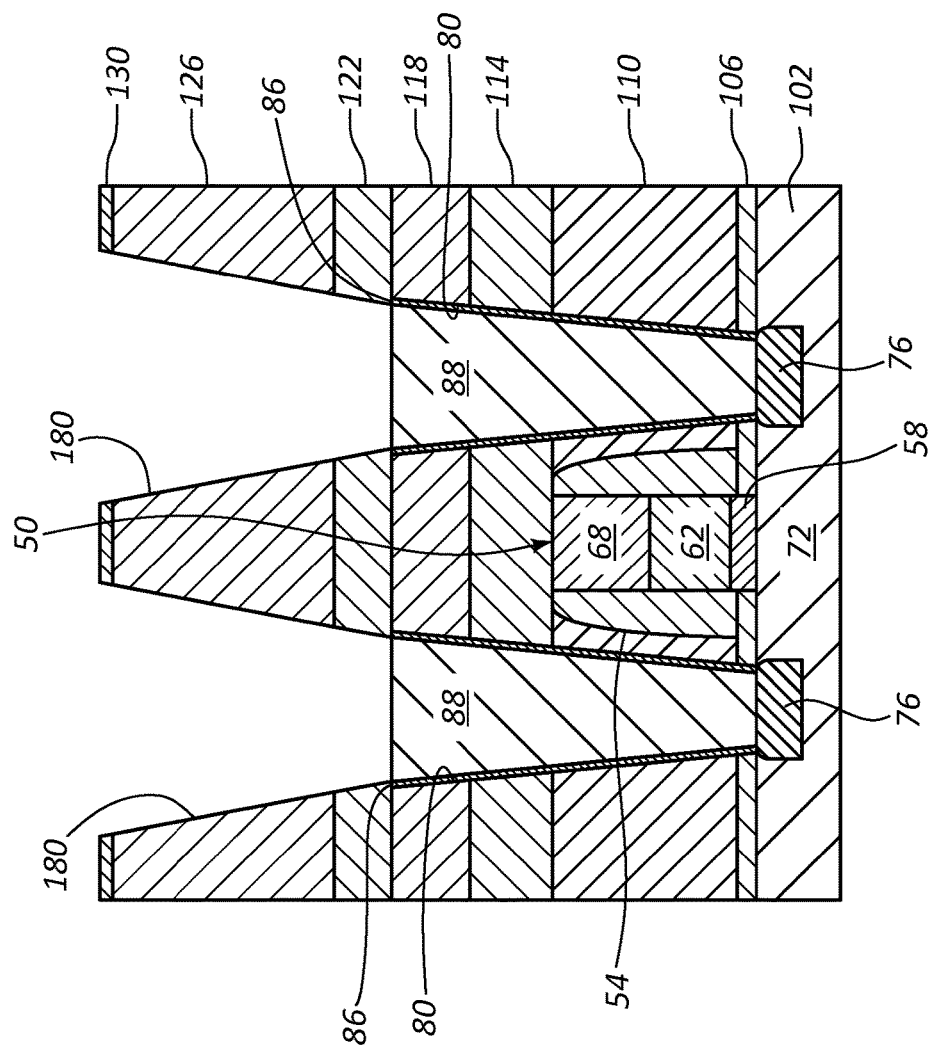
FIG. 7 is a side view of semiconductor structure as shown in FIG. 6 after removal of a sacrificial material layer.

FIG. 7 illustrates performance of block 214 in one embodiment. Referring to FIG. 7 there can be performed removing of a remainder of the sacrificial material layer 144 from the contact trench 180.

In one embodiment, as noted in respect to FIGS. 4 and 5, sacrificial material layer 144 can be formed of carbon based material, and removal of material from layer 144 can be performed using a plasma etching process. A remote plasma etch process can be used to selectively remove material of sacrificial material layer 144 from contact trench 180 when sacrificial material layer 144 is formed of a carbon based material. In one embodiment, sacrificial material layer 144 can be formed of spin-on carbon (SOC).

In one embodiment, as noted in respect to FIGS. 4 and 5, sacrificial material layer 144 can be formed of an oxide and a wet etch process can be used to selectively remove material from sacrificial material layer 144.

Figure 8:
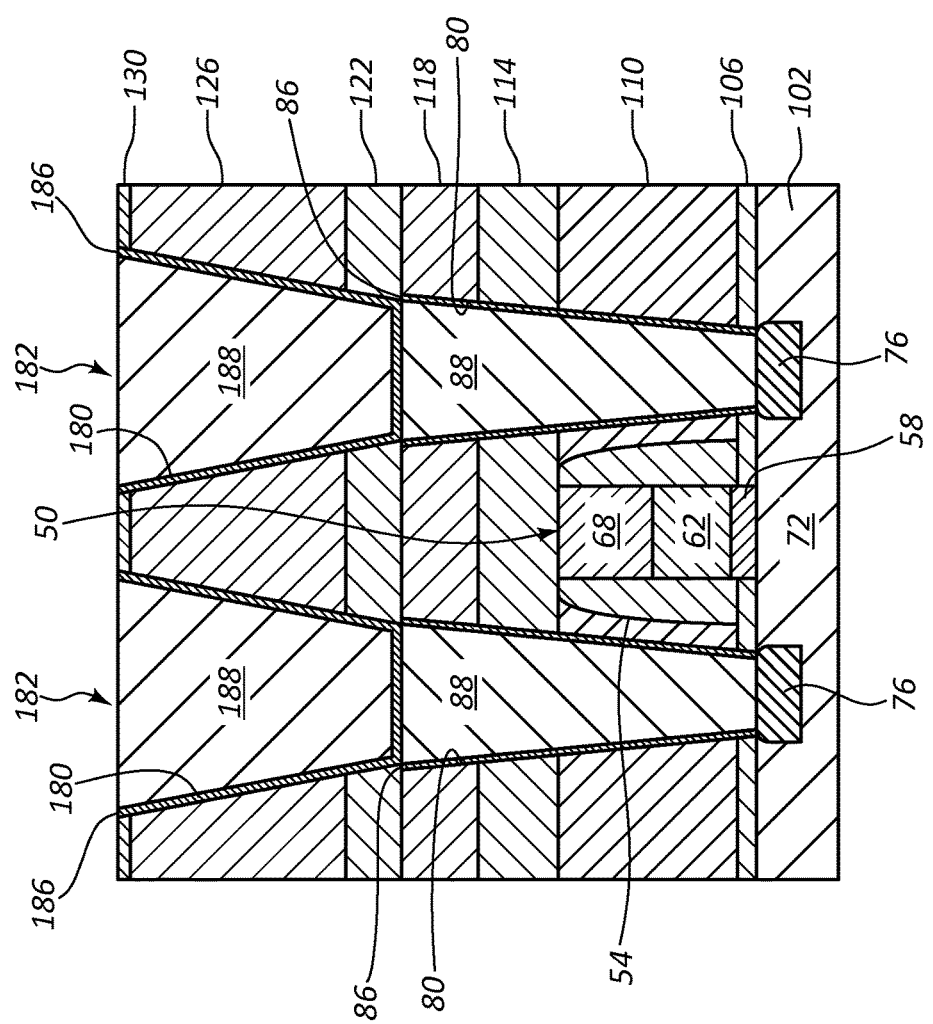
FIG. 8 is a side view of semiconductor structure as shown in FIG. 7 after formation of a contact formation within a contact trench.

With semiconductor structure 10 in the stage as shown in FIG. 7 conductive formations 182 can be formed in contact trenches 180 as shown in FIG. 8. Second conductive formation 182 can include first layer 186 and second layer 188. First layer 186 can be formed e.g., of TiN or Ti, and second layer 188 can be formed, e.g., tungsten (W) or cobalt (Co).

With reference to the specific embodiment of FIGS. 3-8 a method in accordance with the flow diagram of FIG. 2 is described for fabrication of BEOL to MOL contact connection. In another embodiment, the method as set forth herein can be employed for fabrication of a BEOL to BEOL contact formation. In another embodiment, the method as set forth herein can be employed for fabrication of an MOL to MOL contact formation.

There is set forth herein with reference to FIGS. 1-8 a method including forming a contact trench e.g. trench 180 in a semiconductor structure 10 so that the contact trench 180 extends to a contact formation e.g. formation 82, the forming including using a hardmask layer e.g. layer 134.

There is also set forth herein with reference to FIGS. 1-8 a method including filling the contact trench 180 with a sacrificial material layer 180, the sacrificial material layer formed over the contact formation, removing the hardmask layer 134 and removing the sacrificial material layer 144 from the contact trench 180 to expose the contact formation.

There is also set forth herein with reference to FIGS. 1-6, a semiconductor structure 10 having a contact formation 82; one or more dielectric layer e.g. layer 126 formed over the contact formation, a hardmask layer, e.g. layer 134 formed over the one or more dielectric layer, a contact trench, e.g., trench 180 formed in the one or more dielectric layer 126, the contact trench 180 extending to the contact formation 82, and a sacrificial material layer 144 formed in the contact trench 180 over the contact formation 82 to protect the contact formation 82.

Each of the formed layers as set forth herein, e.g., layer 102, 106, layer 110, layer 114, layer 118, layer 122, layer 126, layer 130, layer 134, layer 86, layer 88, layer 186, and/or layer 188 can be formed by way of deposition using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layers for patterning layer 102, 106, layer 110, layer 114, layer 118, layer 122, layer 126, layer 130, layer 134, layer 86, layer 88, layer 186, and/or layer 188 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 102, 106, layer 110, layer 114, layer 118, layer 122, layer 126, layer 130, layer 134, layer 86, layer 88, layer 186, and/or layer 188 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   forming a contact trench in a semiconductor structure so that the contact trench extends to a contact formation, the contact formation comprising a conductive material in contact with one of a separate source and drain, the forming including using a hardmask layer;
   filling the contact trench with a sacrificial material layer, the sacrificial material layer formed over the contact formation;
   removing the hardmask layer;
   removing the sacrificial material layer from the trench to expose the contact formation without exposing the one of a source and drain; and
   wherein the sacrificial material layer is provided by a carbon based material, and wherein the removing the sacrificial material layer includes using a plasma etch process.

2. The method of claim 1, wherein the filling the contact trench includes initially overfilling the contact trench with the sacrificial material layer and then recessing the sacrificial material layer.

3. The method of claim 1, wherein the sacrificial material layer is provided by an oxide, and wherein the removing the sacrificial material layer includes using a wet etch process.

4. The method of claim 1, wherein the contact formation is a middle of the line (MOL) contact formation.

5. The method of claim 1, wherein the contact formation includes a first material, and wherein the hardmask layer is formed of the first material.

6. The method of claim 1, wherein the contact formation includes a first element, and wherein the hardmask layer includes the first element.

7. The method of claim 1, wherein the contact formation and the hardmask layer have a common characteristic.

8. The method of claim 1, wherein the contact formation and the hardmask layer include conductive material.

9. The method of claim 1, wherein material of the contact formation is non-selective with the hardmask layer.

10. A method comprising:
    forming a contact trench in a semiconductor structure so that the contact trench extends to a contact formation, the contact formation comprising a conductive material in contact with one of a separate source and drain, the forming including using a hardmask layer;

filling the contact trench with a sacrificial material layer, the sacrificial material layer formed over the contact formation;

removing the hardmask layer;

removing the sacrificial material layer from the trench to expose the contact formation without exposing the one of a source and drain;

wherein the sacrificial material layer is provided by a carbon based material, and wherein the removing the sacrificial material layer includes using a plasma etch process; and wherein the contact trench is formed in an ultra low k dielectric layer.

11. The method of claim 1, wherein the sacrificial material layer is non-conductive.

12. The method of claim 1, wherein the method is used in a fabrication of a connection selected from the group consisting of a BEOL to MOL connection, a BEOL to BEOL connection, and a MOL to MOL connection.

13. A semiconductor structure comprising:
a contact formation;
one or more dielectric layer formed over the contact formation;
a hardmask layer formed over the one or more dielectric layer;
a contact trench formed in the one or more dielectric layer, the contact trench extending to the contact formation;
a sacrificial material layer formed in the contact trench over the contact formation to protect the contact formation wherein the sacrificial material layer is configured to be selective with respect to the one or more dielectric layer.

14. The semiconductor structure of claim 1, wherein the sacrificial material layer is formed of carbon based material.

15. The semiconductor structure of claim 1, wherein material of the contact formation and the hardmask material layer are formed of a common material.

16. The semiconductor structure of claim 1, wherein material of the contact formation is non-selective with the hardmask material layer.

17. The semiconductor structure of claim 1, wherein the sacrificial material layer is formed of non-conductive material.

* * * * *